United States Patent
Xia et al.

(10) Patent No.: US 11,068,114 B2
(45) Date of Patent: Jul. 20, 2021

(54) DISPLAY PANEL, MANUFACTURING METHOD THEREOF, AND DISPLAY DEVICE

(71) Applicant: Wuhan China Star Optoelectronics Semiconductor Display Technology Co., LTD., Wuhan (CN)

(72) Inventors: Cunjun Xia, Wuhan (CN); Jun Cao, Wuhan (CN)

(73) Assignee: Wuhan China Star Optoelectronics Semiconductor Display Technology Co., LTD., Wuhan (CN)

( * ) Notice: Subject to any disclaimer, the term of this patent is extended or adjusted under 35 U.S.C. 154(b) by 0 days.

(21) Appl. No.: 16/633,303

(22) PCT Filed: Oct. 18, 2019

(86) PCT No.: PCT/CN2019/111998
§ 371 (c)(1),
(2) Date: Jan. 23, 2020

(87) PCT Pub. No.: WO2020/237982
PCT Pub. Date: Dec. 3, 2020

(65) Prior Publication Data
US 2020/0379604 A1    Dec. 3, 2020

(51) Int. Cl.
*G06F 3/044* (2006.01)
*H01L 27/32* (2006.01)
*G06F 3/047* (2006.01)
*G06F 3/041* (2006.01)

(52) U.S. Cl.
CPC ............ *G06F 3/0446* (2019.05); *G06F 3/047* (2013.01); *G06F 3/0412* (2013.01); *H01L 27/323* (2013.01); *H01L 27/3246* (2013.01); *G06F 2203/04103* (2013.01); *H01L 2227/323* (2013.01)

(58) Field of Classification Search
None
See application file for complete search history.

(56) References Cited

U.S. PATENT DOCUMENTS

2017/0075452 A1* 3/2017 Kim ................... G06F 3/0446
2019/0012022 A1* 1/2019 Ye ..................... H01L 27/323
(Continued)

FOREIGN PATENT DOCUMENTS

| CN | 107092399 A | 8/2017 |
| CN | 107272958 A | 10/2017 |
| CN | 107291295 A | 10/2017 |

(Continued)

*Primary Examiner* — Ifedayo B Iluyomade
(74) *Attorney, Agent, or Firm* — Neugeboren O'Dowd PC

(57) ABSTRACT

The present invention provides a display panel, a manufacturing method thereof, and a display device. The display panel comprises a pixel defining layer and a touch electrode. The pixel defining layer covers the touch electrode. The pixel defining layer is provided with a bonding hole, and the touch electrode is connected to a driving circuit of the display panel through the bonding hole. The display panel of the present invention embeds the touch electrode in the pixel defining layer, which can reduce an increase in a thickness of the display panel by the additional touch electrode, thereby reducing the thickness of the display panel.

14 Claims, 8 Drawing Sheets

(56) References Cited

U.S. PATENT DOCUMENTS

2020/0124901 A1  4/2020  Li
2020/0194505 A1  6/2020  Tang

FOREIGN PATENT DOCUMENTS

| CN | 201710508748 | * 10/2017 | ............ G06F 3/041 |
|---|---|---|---|
| CN | 108693994 A | 10/2018 | |
| CN | 109377879 A | 2/2019 | |
| CN | 109671747 A | 4/2019 | |

* cited by examiner

DISPLAY PANEL, MANUFACTURING METHOD THEREOF, AND DISPLAY DEVICE

FIELD OF INVENTION

The present invention relates to the field of display technologies, and in particular, to a display panel, a manufacturing method thereof, and a display device.

BACKGROUND OF INVENTION

Compared with liquid crystal displays, active matrix organic light emitting diodes (AMOLEDs) have high contrast, wide viewing angle, fast image response, etc., thereby causing people to attention and development. With the expansion of the application field of organic light emitting diodes (OLEDs), the demand for flexible display screens is getting higher and higher. However, the flexible display screens have higher requirements on a thickness, and are easy to break if the thickness too thick. Additional touch electrodes on a display panel can significantly increase an overall thickness of the display panel, which is not conducive to the manufacturing of the flexible display panel.

That is, in the prior art, the display panel is too thick.

Technical Problem

That is, in the prior art, the display panel is too thick.

Technical Solution

An embodiment of the present invention provides a display panel, a manufacturing method thereof, and a display device, which can reduce a thickness of the display panel.

To solve the above problem, in a first aspect, the present invention provides a display panel comprising a pixel defining layer and a touch electrode;

wherein the pixel defining layer covers the touch electrode; and wherein the pixel defining layer is provided with a bonding hole, and the touch electrode is connected to a driving circuit of the display panel through the bonding hole.

The pixel defining layer comprises a first pixel defining layer and a second pixel defining layer disposed adjacent with each other, a receiving cavity is formed between the first pixel defining layer and the second pixel defining layer, and the receiving cavity covers the touch electrode.

A signal line and an anode are disposed on a side of the first pixel defining layer away from the second pixel defining layer, the signal line and the anode are disposed on a same layer and are spaced apart from each other, the bonding hole passes through the first pixel defining layer, one end of the signal line is connected to the touch electrode through the bonding hole, and the other end of the signal line is connected to the driving circuit of the display panel.

The display panel further comprises a via hole passing through the first pixel defining layer and the second pixel defining layer, and extending to the anode to expose the anode.

The second pixel defining layer has a thickness of 3 micrometers to 4 micrometers.

The first pixel defining layer is integrally formed with the second pixel defining layer.

The touch electrode is a grid metal wire.

To solve the above problem, in a second aspect, the present invention provides a display device comprising a display panel having a pixel defining layer and a touch electrode;

wherein the pixel defining layer covers the touch electrode; and wherein the pixel defining layer is provided with a bonding hole, and the touch electrode is connected to a driving circuit of the display panel through the bonding hole.

The pixel defining layer comprises a first pixel defining layer and a second pixel defining layer disposed adjacent with each other, a receiving cavity is formed between the first pixel defining layer and the second pixel defining layer, and the receiving cavity covers the touch electrode.

A signal line and an anode are disposed on a side of the first pixel defining layer away from the second pixel defining layer, the signal line and the anode are disposed on a same layer and are spaced apart from each other, the bonding hole passes through the first pixel defining layer, one end of the signal line is connected to the touch electrode through the bonding hole, and the other end of the signal line is connected to the driving circuit of the display panel.

The display panel further comprises a via hole passing through the first pixel defining layer and the second pixel defining layer, and extending to the anode to expose the anode.

The second pixel defining layer has a thickness of 3 micrometers to 4 micrometers.

The first pixel defining layer is integrally formed with the second pixel defining layer.

The touch electrode is a grid metal wire.

To solve the above problem, in a third aspect, the present invention provides a manufacturing method of a display panel. The manufacturing method comprises the following steps:

providing a device layer; and forming a pixel defining layer and a touch electrode on the device layer;

wherein the pixel defining layer covers the touch electrode; and wherein the pixel defining layer is provided with a bonding hole, and the touch electrode is connected to a driving circuit of the display panel through the bonding hole.

The pixel defining layer comprises a first pixel defining layer and a second pixel defining layer disposed adjacent with each other, and the step of forming the pixel defining layer and the touch electrode on the device layer comprises:

forming the first pixel defining layer;

forming the touch electrode on the first pixel defining layer; and forming the second pixel defining layer on a side of the touch electrode away from the first pixel defining layer;

wherein a receiving cavity is formed between the first pixel defining layer and the second pixel defining layer, and the receiving cavity covers the touch electrode.

The step of providing the device layer comprises:

forming a planarization layer;

forming a metal layer on the planarization layer; and processing the metal layer to form an anode and a signal line disposed on a same layer and spaced apart from each other.

The step of forming the first pixel defining layer comprises:

forming a bonding hole and a first via hole on the first pixel defining layer;

wherein the touch electrode is connected to the driving circuit of the display panel through the bonding hole, and the anode is exposed through the first via hole.

Beneficial Effect

The beneficial effects of the invention are: different from the prior art, the present invention provides a display panel. The display panel comprises a pixel defining layer and a touch electrode. The pixel defining layer covers the touch electrode. The pixel defining layer is provided with a bonding hole, and the touch electrode is connected to a driving circuit of the display panel through the bonding hole. The display panel of the present invention embeds the touch electrode in the pixel defining layer, which can reduce an increase in a thickness of the display panel by the additional touch electrode, thereby reducing the thickness of the display panel.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

Figure 1:
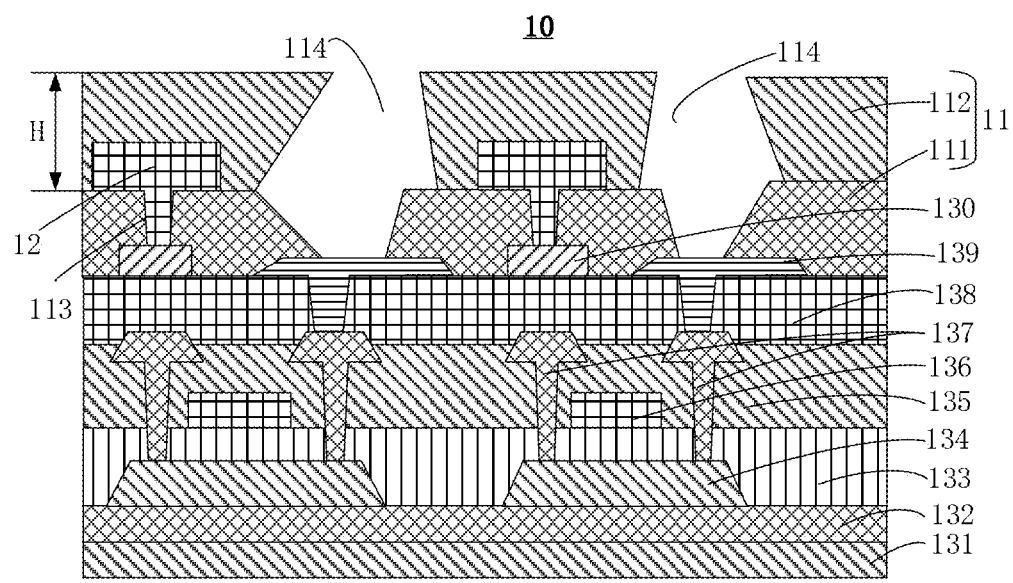
FIG. 1 is a cross-sectional structural view showing an embodiment of a display panel according to an embodiment of the present invention.

The present invention will be further described in detail below with reference to the accompanying drawings and embodiments. In particular, the following examples are only intended to illustrate the invention, but do not limit the scope of the invention. In the same manner, the following embodiments are only partial embodiments rather than all embodiments of the present invention, and all other embodiments obtained by those skilled in the art without creative efforts are within the scope of the present invention.

In the description of the present invention, it is to be understood that the terms indicate orientation or positional relationship, such as "center", "longitudinal", "transverse", "length", "width", "thickness", "upper", "lower", "front", "back", "left", "right", "vertical", "horizontal", "top", "bottom", "inside", "outside", etc., is based on the orientation or positional relationship shown in the drawings. The present invention and the simplified description are merely for convenience of description, and are not intended to indicate or imply that the device or component referred to must have a specific orientation, constructed, and operated in a specific orientation. Therefore, it cannot be understood as a limitation on this application. Moreover, the terms "first" and "second" are used for descriptive purposes only and are not to be understood as indicating or implying a relative importance or implicitly indicating the number of technical features indicated. Thus, features defining "first" and "second" may explicitly or implicitly include one or more features. In the description of the present application, the meaning of "a plurality" is two or more unless specifically and specifically defined otherwise.

The term "example" in this invention means "serving as an example, instance, or illustration," and is not meant embodiment "more preferable" or "advantage" over other embodiments. The following description is provided to enable any person skilled in the art to make or use the present innovation. For purposes of explanation, details are given in the following description. It should be appreciated that those skilled in the art will be appreciated, the present innovation may be practiced without these specific details. In other instances, well-known structures and processes are not described in detail, in order to avoid unnecessary detail description of the present invention is difficult to understand. Accordingly, the present invention is not intended to be limited by the example but is consistent with the principles and features disclosed herein as the widest scope.

An embodiment of the present invention provides a display panel comprising a pixel defining layer and a touch electrode. The pixel defining layer covers the touch electrode. The pixel defining layer is provided with a bonding hole, and the touch electrode is connected to a driving circuit of the display panel through the bonding hole. The display panel of the embodiment of the present invention can be applied to a display device. Detailed descriptions are as follows.

Figure 2:
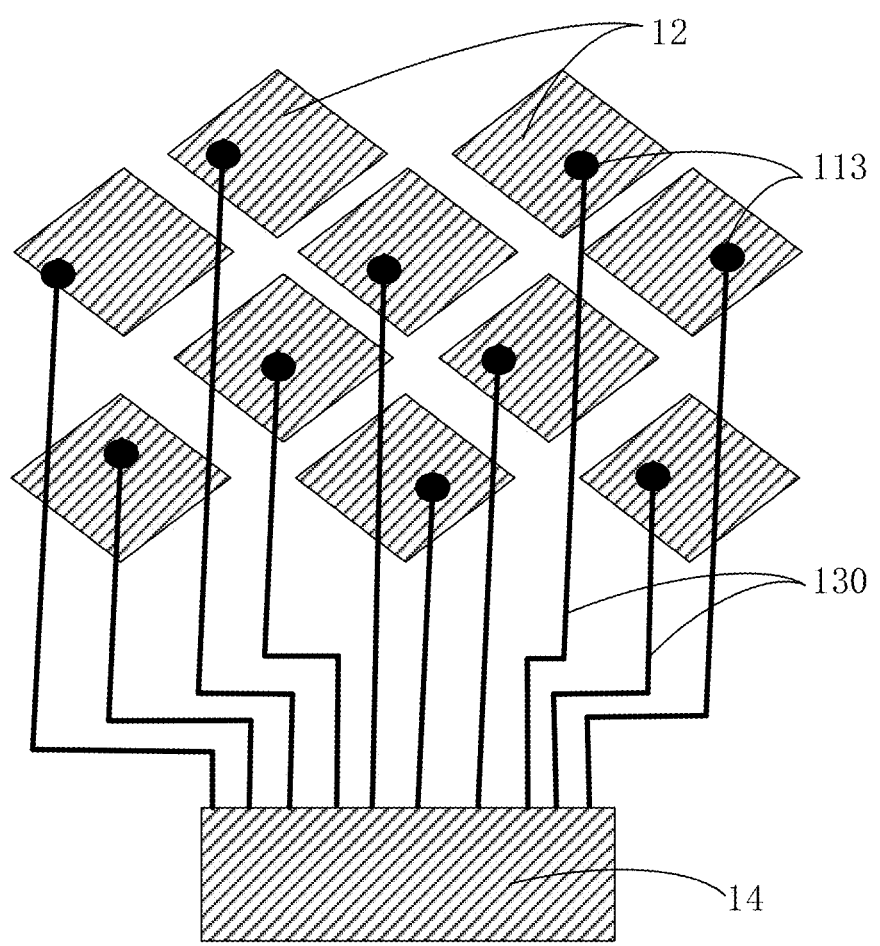
FIG. 2 is a schematic plan view showing a connection manner of a touch electrode and a driving circuit in the display panel of FIG. 1.

Please refer to FIG. 1 and FIG. 2. FIG. 1 is a cross-sectional structural view showing an embodiment of a display panel according to an embodiment of the present invention, and FIG. 2 is a schematic plan view showing a connection manner of a touch electrode and a driving circuit in the display panel of FIG. 1.

In the embodiment, the display panel 10 comprises a pixel defining layer 11 and a touch electrode 12. The pixel defining layer 11 covers the touch electrode 12. The pixel defining layer 11 is provided with a bonding hole 113, and the touch electrode 12 is connected to a driving circuit 14 of the display panel 10 through the bonding hole 113. The display panel 10 of the present invention embeds the touch electrode 12 in the pixel defining layer 11. The pixel definition layer 11 and the touch electrode 12 share a thickness, which can reduce an increase in a thickness of the display panel 10 by the additional touch electrode 12, thereby reducing the thickness of the display panel 10.

In the embodiment, the pixel defining layer 11 comprises a first pixel defining layer 111 and a second pixel defining layer 112 disposed adjacent with each other. A receiving cavity is formed between the first pixel defining layer 111 and the second pixel defining layer 112, and the receiving cavity covers the touch electrode 12.

In a specific embodiment, the materials of the first pixel defining layer 111 and the second pixel defining layer 112 are the same, and the manufacturing process is the same. The first pixel defining layer 111 and the second pixel defining layer 112 are sequentially manufactured and disposed adjacent to each other to cover the touch electrode 12. In another specific embodiment, the first pixel defining layer 111 is integrally formed with the second pixel defining layer 112, which can simplify the film layer forming process and enhance the integrity of the film layer. In other embodiments, the materials of the first pixel defining layer 111 and the second pixel defining layer 112 may be different, and the manufacturing process may be different, which is not limited in this invention.

In the embodiment, a signal line 130 and an anode 139 are disposed on a side of the first pixel defining layer 111 away from the second pixel defining layer 112. The signal line 130 and the anode 139 are disposed on a same layer and are spaced apart from each other. The bonding hole 113 passes through the first pixel defining layer 111, one end of the signal line 130 is connected to the touch electrode 12 through the bonding hole 113, and the other end of the signal line 130 is connected to the driving circuit 14 of the display panel 10. Disposing the signal line 130 and the anode 139 in the same layer enables the signal line 130 and the anode 139 to share a thickness of the panel, thereby reducing the overall thickness of the display panel 10. Disposing the signal line 130 and the anode 139 spaced apart from each other can avoid mutual interference between the signal line 130 and the anode 139. Moreover, the signal line 130 and the anode 139 can be formed by one process, which can improve the forming efficiency of the display panel 10 and reduce the manufacturing cost.

In the embodiment, the touch electrode 12 is a self-capacitive touch electrode. Preferably, the touch electrode 12 is a grid metal wire. The driving circuit 14 detects changes of a capacitance of each touch electrode 12 itself. When a finger approaches or touches the touch screen, a capacitance of the finger is superimposed on the screen capacitor to increase the capacitance of the screen. In the touch detection, M X-axis and N Y-axis click arrays are detected at one time. According to the change of all self-electric capacity before and after the touch, a X coordinate and a Y coordinate of the finger are determined, and finally a touch coordinates of the plane are combined.

In the embodiment, the display panel 10 comprises a via hole 114 passing through the first pixel defining layer 111 and the second pixel defining layer 112, and extending to the anode 139 to expose the anode 139. The anode 139 is exposed through the via hole 114 to facilitate manufacture of the subsequent film layer. After the anode 139 is exposed, an organic light emitting element (including a hole injection layer, a hole transport layer, a light emitting layer, an electron transport layer, an electron injection layer, a cathode, etc.) can be manufactured on the anode 139 after the touch electrode 12 is formed. Therefore, it can avoid an influence on a performance of the packaged organic light emitting device when the touch electrode 12 is formed by a wet process, and quality of the display panel 30 is improved.

In the embodiment, a thickness H of the second pixel defining layer 112 is 3 micrometers to 4 micrometers. In other embodiments, the thickness H of the second pixel defining layer 112 is set according to a specific situation, which is not limited in the invention.

Further, in the embodiment, the display panel 10 further comprises a substrate 131, a buffer layer 132, an active layer 133, a gate insulating layer 134, a gate layer 136, an interlayer dielectric layer 135, a source drain layer 137, and a planarization layer 138 which are sequentially stacked. The anode 139 and the signal line 130 are disposed between the planarization layer 138 and the first pixel defining layer 111, and the anode 139 is connected to the source drain layer 137 through the planarization layer 138.

Different from the prior art, the present invention provides a display panel comprising a pixel defining layer and a touch electrode. The pixel defining layer covers the touch electrode. The pixel defining layer is provided with a bonding hole, and the touch electrode is connected to a driving circuit of the display panel through the bonding hole. The display panel of the present invention embeds the touch electrode in the pixel defining layer, which can reduce an increase in a thickness of the display panel by the additional touch electrode, thereby reducing the thickness of the display panel.

Figure 3:
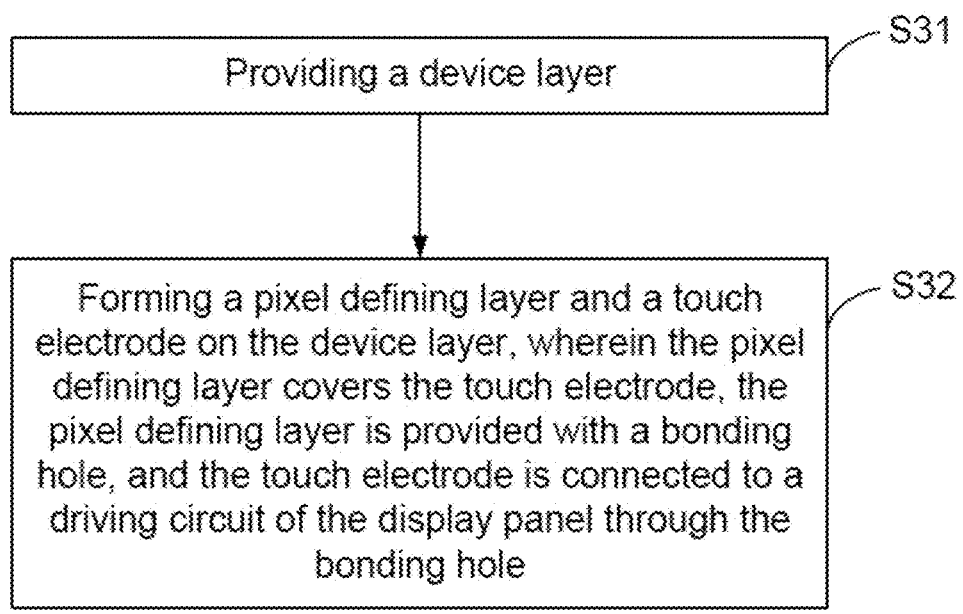
FIG. 3 is a schematic flow chart of an embodiment of a manufacturing method of the display panel according to an embodiment of the present invention.
Figure 4:
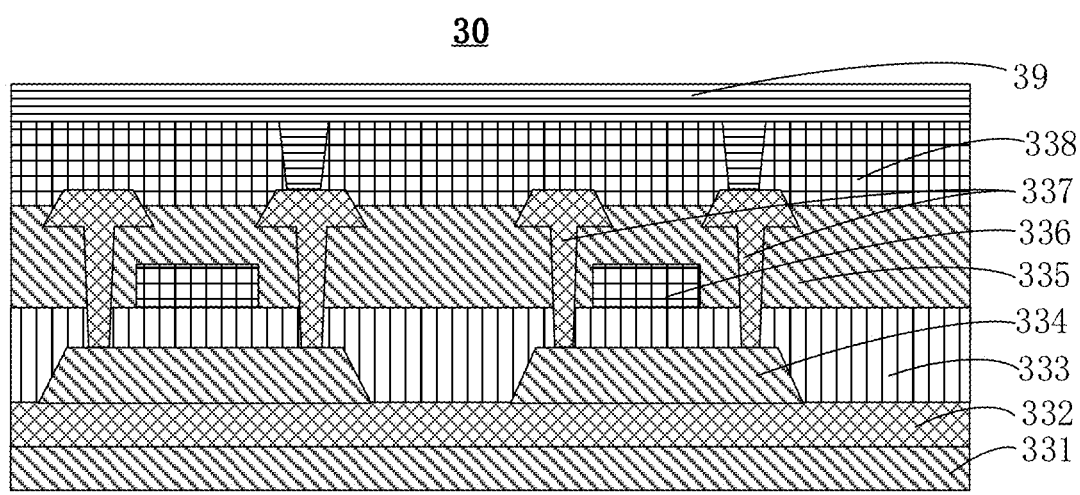
FIG. 4 is a schematic cross-sectional view of the display panel after forming a metal layer on a planarization layer in S31.
Figure 5:
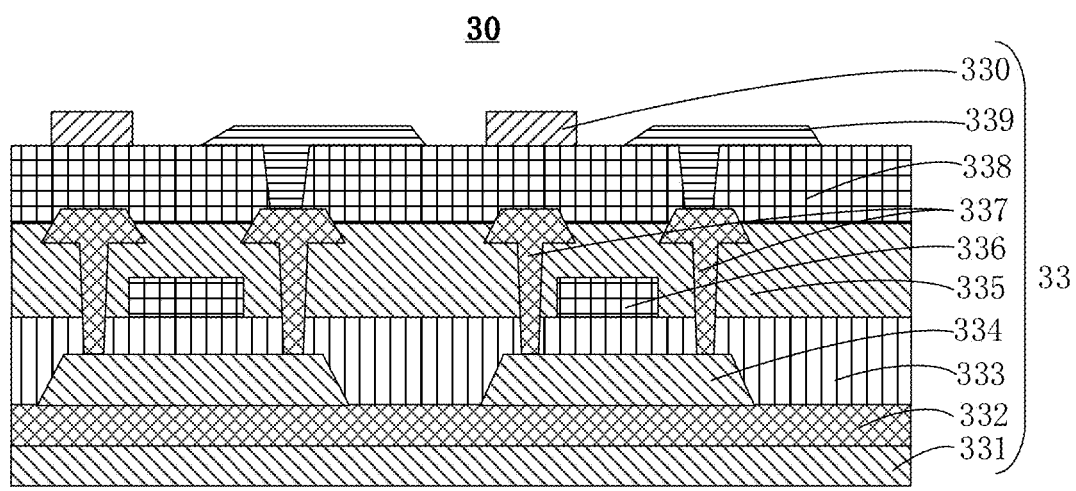
FIG. 5 is a schematic cross-sectional structural view of the display panel after forming an anode and a signal line in S31.
Figure 6:
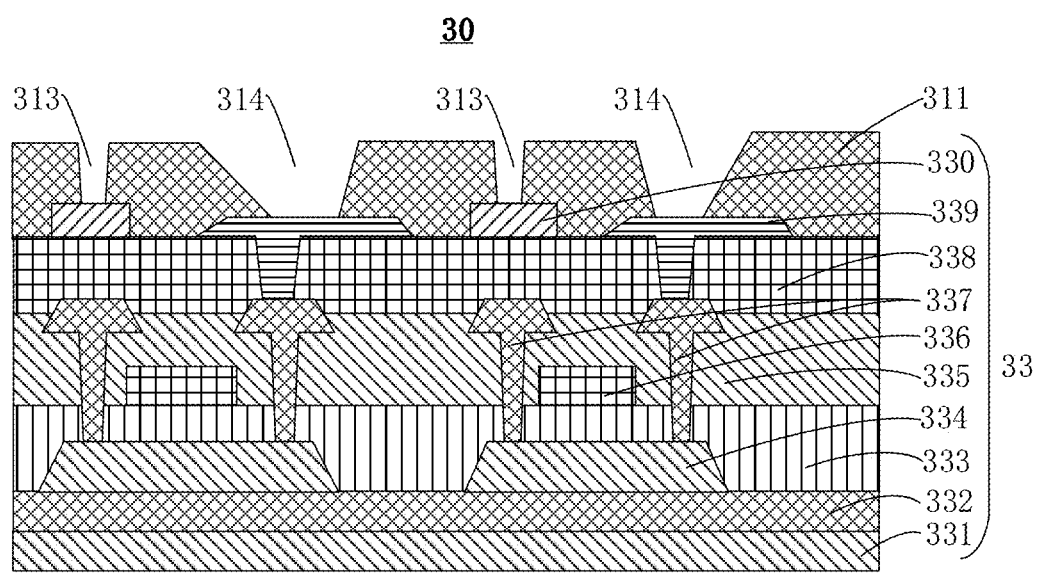
FIG. 6 is a schematic cross-sectional view of the display panel after forming a first pixel defining layer in S32.
Figure 7:
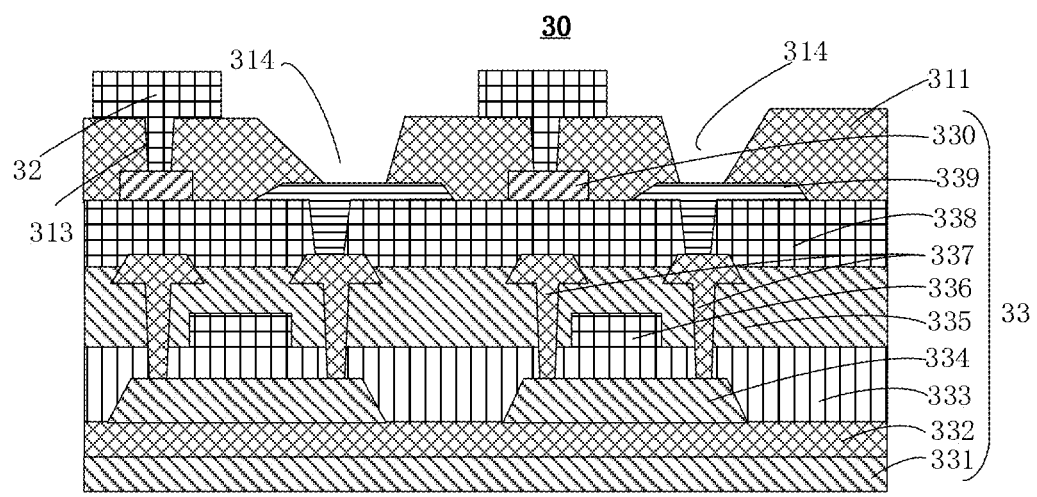
FIG. 7 is a schematic cross-sectional view of the display panel after forming a touch electrode in S32.
Figure 8:
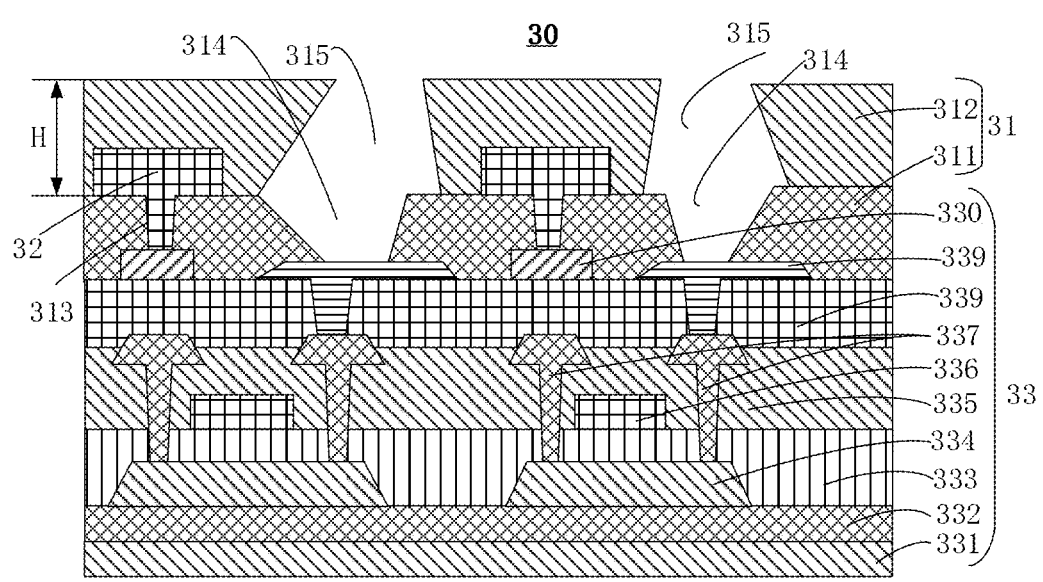
FIG. 8 is a schematic cross-sectional view of the display panel after forming a second pixel defining layer in S32.

Please refer to FIG. 3 to FIG. 8. FIG. 3 is a schematic flow chart of an embodiment of a manufacturing method of the display panel according to an embodiment of the present invention. FIG. 4 is a schematic cross-sectional view of the display panel after forming a metal layer on a planarization layer in S31. FIG. 5 is a schematic cross-sectional structural view of the display panel after forming an anode and a signal line in S31. FIG. 6 is a schematic cross-sectional view of the display panel after forming a first pixel defining layer in S32. FIG. 7 is a schematic cross-sectional view of the display panel after forming a touch electrode in S32. FIG. 8 is a schematic cross-sectional view of the display panel after forming a second pixel defining layer in S32.

With reference to FIG. 3 to FIG. 8, the manufacturing method of the display panel of the present embodiment may comprise the following steps.

S31: providing a device layer.

As shown in FIG. 4, in the embodiment, a buffer layer 332, an active layer 333, a gate insulating layer 334, a gate layer 336, an interlayer dielectric layer 335, a source drain layer 337, and a planarization layer 138 are sequentially stacked on the substrate 331.

A metal layer 39 is formed on the planarization layer 338. In a specific embodiment, the metal layer 39 is deposited on a surface of the planarization layer 338 by physical vapor deposition.

As shown in FIG. 5, in the embodiment, the metal layer 39 is processed to form on a same layer, and the anodes 339 and the signal lines 330 are spaced apart from each other. So far, the steps of forming the device layer 33 are completed. In a specific embodiment, the anode 339 and the signal line 330 are formed by a coating, exposure, development, etc. using photolithography. The signal lines 330 are disposed in a strip shape and are disconnected from the anode 339. Disposing the signal line 330 and the anode 339 in the same layer enables the signal line 330 and the anode 339 to share a thickness of the panel, thereby reducing the overall thickness of the display panel 30. By spacing the signal line 330 and the anode 339, signals between the signal line 330 and the anode 339 can be prevented from interfering with each other. Moreover, the signal line 130 and the anode 139 can be formed by one process, which can improve the forming efficiency of the display panel 10 and reduce the manufacturing cost.

S32: forming a pixel defining layer and a touch electrode on the device layer, wherein the pixel defining layer covers the touch electrode, the pixel defining layer is provided with a bonding hole, and the touch electrode is connected to a driving circuit of the display panel through the bonding hole.

As shown in FIG. 6, after the anode 339 and the signal line 330 are formed, forming a first pixel defining layer 311. Specifically, the bonding hole 313 and the first via hole 314 are formed on the first pixel defining layer 311, wherein the touch electrode 32 is connected to the driving circuit of the display panel 30 through the bonding hole 313, and the anode 339 is exposed by the first via hole 314.

Further, as shown in FIG. 7, the touch electrode 32 is formed on the first pixel defining layer 311. Specifically, the touch metal layer is deposited by physical vapor deposition, and then the touch electrode 32 is formed by a process such as coating, exposure, and development. Preferably, the touch electrode 32 is a grid metal wire. After the touch electrode 32 is formed, an organic light emitting device process only completes manufacture of the anode 339. That is, before the start of the organic light emitting device process, the touch electrode 32 has been formed, which can avoid the influence of the performance of the packaged organic light emitting device when the touch electrode 32 is formed by the wet process, and improve the quality of the display panel 30.

Further, as shown in FIG. 8, forming the second pixel defining layer 312 on a side of the touch electrode 32 away from the first pixel defining layer 311, wherein a receiving cavity is formed between the first pixel defining layer 311 and the second pixel defining layer 312, and the receiving cavity covers the touch electrode 32.

In the embodiment, the pixel defining layer 31 comprises the first pixel defining layer 311 and the second pixel defining layer 312 disposed adjacent with each other. The first pixel defining layer 311 and the second pixel defining layer 312 are sequentially formed to form the pixel defining layer 31, thereby covering the touch electrode 32. In other embodiments, the first pixel defining layer 311 and the second pixel defining layer 312 may also be formed by one process to form an integrally formed pixel defining layer 31, which is not limited in the invention.

Further, a second via hole 315 is formed on the second pixel defining layer 312. The second via hole 315 is in communication with the first via hole 314 to expose the anode 339. In a preferred embodiment, the second pixel defining layer 312 has a thickness H of 3-4 um. In other embodiments, the thickness H of the second pixel defining layer 312 is set according to a specific situation, which is not limited in the invention.

Different from the prior art, the present invention provides a manufacturing method of the display panel. The manufacturing method of the display panel comprises: providing a device layer; and forming a pixel defining layer and a touch electrode on the device layer; wherein the pixel defining layer covers the touch electrode; and wherein the pixel defining layer is provided with a bonding hole, and the touch electrode is connected to a driving circuit of the display panel through the bonding hole. The display panel of the present invention embeds the touch electrode in the pixel defining layer, which can reduce an increase in a thickness of the display panel by the additional touch electrode, thereby reducing the thickness of the display panel.

In specific implementation, each of the above units or structures may be implemented as a separate entity, or may be combined in any combination, as one or several entities. For the specific implementation of the above various units or structures, refer to the foregoing method embodiments, and details are not described herein again.

The display panel and the manufacturing method thereof provided by the embodiments of the present invention are described in detail above. The principles and embodiments of the present invention are described by applying specific examples. The description of the above embodiments is only for helping to understand the method of the present invention and its core ideas. At the same time, for those skilled in the art, according to the idea of the present invention, there will be changes in specific embodiments and applications. In summary, the contents of this specification should not be construed as limiting the application.

What is claimed is:

1. A display panel, comprising:
   a pixel defining layer and a touch electrode;
   wherein the touch electrode is embedded in the pixel defining layer; and
   wherein the pixel defining layer is provided with a bonding hole, and the touch electrode is connected to a driving circuit of the display panel through the bonding hole;
   wherein the pixel defining layer comprises a first pixel defining layer and a second pixel defining layer disposed adjacent with each other, a receiving cavity is formed between the first pixel defining layer and the second pixel defining layer, and the receiving cavity covers the touch electrode, and
   a signal line and an anode are disposed on a side of the first pixel defining layer away from the second pixel defining layer, the signal line and the anode are disposed on a same layer and are spaced apart from each other, the bonding hole passes through the first pixel defining layer, one end of the signal line is connected to the touch electrode through the bonding hole, and the other end of the signal line is connected to the driving circuit of the display panel.

2. The display panel as claimed in claim 1, further comprising a via hole passing through the first pixel defining layer and the second pixel defining layer, and extending to the anode to expose the anode.

3. The display panel as claimed in claim 1, wherein the second pixel defining layer has a thickness of 3 micrometers to 4 micrometers.

4. The display panel as claimed in claim 2, wherein the second pixel defining layer has a thickness of 3 micrometers to 4 micrometers.

5. The display panel as claimed in claim 1, wherein the first pixel defining layer is integrally formed with the second pixel defining layer.

6. The display panel as claimed in claim 1, wherein the touch electrode is a grid metal wire.

7. A display device, comprising:
   a display panel comprising a pixel defining layer and a touch electrode;
   wherein the touch electrode is embedded in the pixel defining layer; and
   wherein the pixel defining layer is provided with a bonding hole, and the touch electrode is connected to a driving circuit of the display panel through the bonding hole;
   wherein the pixel defining layer comprises a first pixel defining layer and a second pixel defining layer disposed adjacent with each other, a receiving cavity is formed between the first pixel defining layer and the second pixel defining layer, and the receiving cavity covers the touch electrode; and
   a signal line and an anode are disposed on a side of the first pixel defining layer away from the second pixel defining layer, the signal line and the anode are disposed on a same layer and are spaced apart from each other, the bonding hole passes through the first pixel defining layer, one end of the signal line is connected to the touch electrode through the bonding hole, and the other end of the signal line is connected to the driving circuit of the display panel.

8. The display device as claimed in claim 7, wherein the display panel further comprises a via hole passing through the first pixel defining layer and the second pixel defining layer, and extending to the anode to expose the anode.

9. The display device as claimed in claim 7, wherein the second pixel defining layer has a thickness of 3 micrometers to 4 micrometers.

10. The display device as claimed in claim 8, wherein the second pixel defining layer has a thickness of 3 micrometers to 4 micrometers.

11. The display device as claimed in claim 7, wherein the first pixel defining layer is integrally formed with the second pixel defining layer.

12. The display device as claimed in claim 7, wherein the touch electrode is a grid metal wire.

13. A manufacturing method of a display panel, comprising the following steps:
providing a device layer; and
forming a pixel defining layer and a touch electrode on the device layer;
wherein the touch electrode is embedded in the pixel defining layer; and
wherein the pixel defining layer is provided with a bonding hole, and the touch electrode is connected to a driving circuit of the display panel through the bonding hole;
the pixel defining layer comprises a first pixel defining layer and a second pixel defining layer disposed adjacent with each other, and the step of forming the pixel defining layer and the touch electrode on the device layer comprises:
forming the first pixel defining layer;
forming the touch electrode on the first pixel defining layer; and
forming the second pixel defining layer on a side of the touch electrode away from the first pixel defining layer;
wherein a receiving cavity is formed between the first pixel defining layer and the second pixel defining layer, and the receiving cavity covers the touch electrode; and
wherein the step of providing the device layer comprises:
forming a planarization layer;
forming a metal layer on the planarization layer; and
processing the metal layer to form an anode and a signal line disposed on a same layer and spaced apart from each other.

14. The manufacturing method as claimed in claim 13, wherein the step of forming the first pixel defining layer comprises:
forming the bonding hole and a first via hole on the first pixel defining layer;
wherein the touch electrode is connected to the driving circuit of the display panel through the bonding hole, and the anode is exposed through the first via hole.

* * * * *